US00RE36212E

United States Patent [19]

Matsuo et al.

[11] E Patent Number: Re. 36,212

[45] Reissued Date of Patent: May 25, 1999

[54] IMAGE TRANSFER APPARATUS

[75] Inventors: Masaaki Matsuo; Takayuki Kimura, both of Tokyo, Japan

[73] Assignee: Toyo Ink Manufacturing Co., Ltd., Tokyo, Japan

[21] Appl. No.: 08/677,870

[22] Filed: Jul. 10, 1996

Related U.S. Patent Documents

Reissue of:

[64] Patent No.: 5,408,297
Issued: Apr. 18, 1995
Appl. No.: 08/157,203
Filed: May 17, 1994

[30] Foreign Application Priority Data

Apr. 13, 1992 [JP] Japan ..... 4-119680
Apr. 13, 1992 [JP] Japan ..... 4-119681

[51] Int. Cl.[6] ..... G03B 27/22; B41F 1/28; B41F 21/00; B41F 21/10

[52] U.S. Cl. ..... 355/104; 101/415.1; 492/25

[58] Field of Search ..... 101/415.1; 355/103, 355/104, 106, 107, 110; 399/159; 492/25, 30

[56] References Cited

U.S. PATENT DOCUMENTS

| | | | |
|---|---|---|---|
| 3,456,587 | 7/1969 | Hulen . | |
| 4,259,904 | 4/1981 | Metje . | |
| 4,298,278 | 11/1981 | Katakura et al. | 355/104 X |
| 5,019,860 | 5/1991 | Matsuo et al. | 355/104 |
| 5,094,164 | 3/1992 | Kowalczyk et al. | 355/104 X |
| 5,243,379 | 9/1993 | Lein | 355/104 X |
| 5,322,014 | 6/1994 | Keller | 101/415.1 X |

FOREIGN PATENT DOCUMENTS

| | | |
|---|---|---|
| 1-168182 | 6/1989 | Japan . |
| 3-033750 | 2/1991 | Japan . |
| 3157652 | 5/1991 | Japan . |
| 3-129354 | 6/1991 | Japan . |
| 3-209480 | 9/1991 | Japan . |

*Primary Examiner*—R. L. Moses
*Attorney, Agent, or Firm*—Wenderoth,Lind & Ponack, L.L.P.

[57] ABSTRACT

An image transfer apparatus which comprises a platen (8) to which an image-forming material is to be attached and a transfer cylinder (1) to which an image receptor is to be attached, and which is for transferring an image formed in a photosensitive layer of an image-forming material to an image receptor by the introduction of the image-forming material and the image receptor into a nip formed by the platen and the transfer cylinder by the rotation of the platen and the transfer cylinder, the apparatus having an image-forming material attaching device comprising a device for holding the top end side of the image receptor to a platen surface along the entire width of the image receptor and a device for holding the bottom end side of the image receptor to a platen surface along the entire width of the image receptor, the device for holding the top end side being a pin bar (13) having pins protruded from an inside of a blanket (10) in a slope portion (12) continued from a partial cut-off portion formed in the platen.

8 Claims, 4 Drawing Sheets

IMAGE TRANSFER APPARATUS

Matter enclosed in heavy brackets [ ] appears in the original patent but forms no part of this reissue specification; matter printed in italics indicates the additions made by reissue.

TECHNICAL FIELD

The present invention relates to an image transfer apparatus. More specifically, it relates to an image transfer apparatus having a platen equipped with an image-forming material attaching device for improving the registering accuracy and stabilizing the registering, and a transfer cylinder. Further, it relates to an image transfer apparatus having a platen equipped with a means for facilitating the peeling of a protection film from an image-forming material formed of a substrate, a photosensitive layer and the protection film while the image-forming material is attached to the platen, and a transfer cylinder.

TECHNICAL BACKGROUND

A single-color or multi-color prepress proof suitable for proof printing, etch, is recently increasingly produced. The prepress proof is produced by imagewise exposing an image-forming material comprising a substrate and photosensitive layer formed on one surface of the substrate and then transferring an image to an image receptor such as paper under heat, generally around 100° C. The image-forming material is formed of a substrate, a photosensitive layer formed on one surface of said substrate and a protection film. As the substrate and the protection film, a thin film or sheet formed from a material such as cellulose acetate, polystyrene, polyvinyl chloride or polyethylene terephthalate is used. As the image receptor, a properly selected printing sheet such as paper or a film is used.

As an apparatus for preparing the above prepress proof, generally, there has been proposed an image-transfer apparatus having a platen to which an image-forming material is to be attached and a transfer cylinder to which an image receptor is to be attached, and the platen and the transfer cylinder are brought into contact so that a photosensitive layer of the image-forming material and an image receptor are brought into contact with each other under pressure to transfer an image formed on the photosensitive layer to the image receptor in a nip portion formed by the platen and the transfer cylinder. A multi-color image transfer product or a prepress proof sheet is produced by color-scanning an original of multi-color image, imagewise exposing image-forming materials corresponding to separated colors, e.g., yellow, magenta, cyan and black to form images of these colors in the image forming materials, and consecutively transferring these formed images to one image receptor.

As a device for attaching the image-forming material to the platen, a pin bar is generally used to facilitate the registering of each color. The pin bar has a structure in which a plurality of pins are provided on a plate extending in the axial-length direction of the platen. When, however, the pin bar is directly provided on the platen, there is caused a distinct height difference between the platen surface and the pin bar, and the image-forming material which has been attached has a nonuniform slackening. Therefore, the registering accuracy is insufficient in many cases. There is further another problem in that the area on which the printing can be actually effected is decreased since the printing with sufficient registering accuracy cannot be carried out on the pin bar portion.

For producing a multi-color prepress proof, a plurality of image-forming materials and one image receptor are used. After the imagewise exposure, each image-forming material is attached to the platen in a state in which the protection film is stacked. On the platen, the protection film is manually peeled off by an operator. However, it is difficult to peel off the thin protection film, and the peeling off the thin protection film extremely impairs the workability. Further, when the protection film is peeled off, an unexposed portion, i.e., an image portion, is sometimes peeled together, and in such a case, no aesthetically fine image transfer product can be obtained.

It has been strongly desired to develop a device for attaching a sheet-like substance such as an image-forming material without causing a failure in registering and a device with which the protection film of the image-forming material can be easily peeled off. However, no device which satisfies the above desire has been developed.

It is therefore an object of the present invention to provide an image transfer apparatus having a device with which the image-forming material can be attached to the platen without causing a failure in registering. It is further another object of the present invention to provide an image transfer apparatus having a platen equipped with a device for easily peeling off the protection film of the image-forming material and a transfer cylinder.

DISCLOSURE OF THE INVENTION

The present invention provides an image transfer apparatus, which comprises a platen to which an image-forming material is to be attached and a transfer cylinder to which an image receptor is to be attached, and which is for transferring an image formed in a photosensitive layer of an image-forming material to an image receptor by the introduction of the image-forming material and the image receptor into a nip formed by the platen and the transfer cylinder by the rotation of the platen and the transfer cylinder, the apparatus having an image-forming material attaching device comprising a device for holding the top end side of the [image receptor] *image-forming material* to a platen surface along the entire width of the [image receptor] *image-forming material* and a device for holding the bottom end side of the [image receptor] *image-forming material* to a platen surface along the entire width of the [image receptor] *image*-forming material, the device for holding the top end side being a pin bar having pins protruded from an inside of a blanket in a slope portion continued from a partial cut-off portion formed in the platen.

Further, the present invention provides an image transfer apparatus having a means for peeling off a protection film, with which a protection film can be easily peeled off from an image-forming material formed of a substrate, a photosensitive layer formed on the substrate and the protection film stacked on the photosensitive layer while the image-forming material is attached to the platen.

PREFERRED EMBODIMENTS OF THE INVENTION

The present invention will be detailed hereinafter with reference to the attached drawings.

Figure 1:
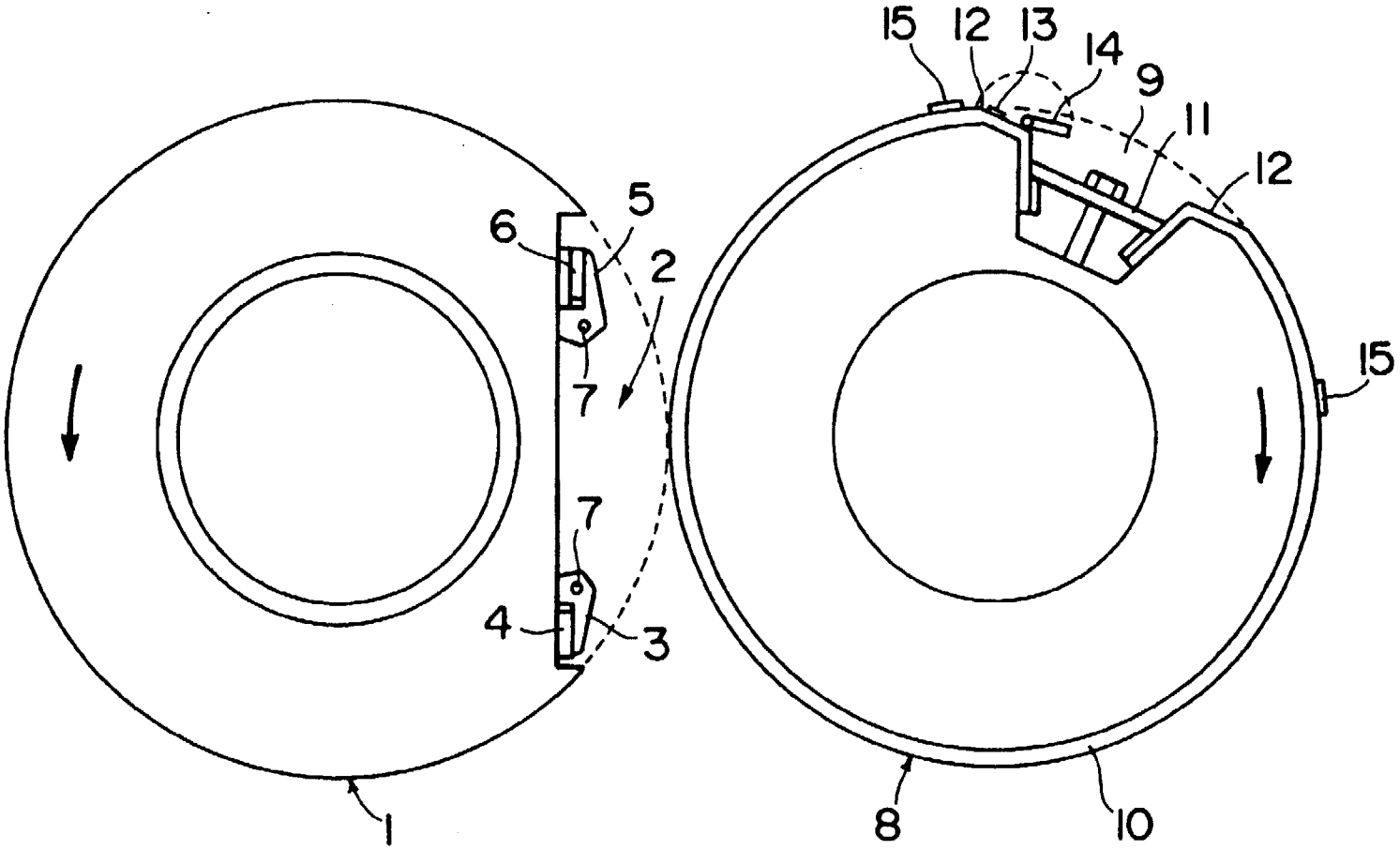
FIG. 1 is a schematic cross-sectional view of an image transfer apparatus used in the present invention.

The constitution of the image transfer apparatus used in the present invention will be explained below with reference to FIG. 1. FIG. 1 is a schematic cross-sectional view of the image transfer apparatus which has a platen equipped with an image-forming material attaching device and to which an image-forming material is to be attached and a transfer cylinder to which an image receptor such as paper is to be attached, provided by the present invention A surface of a transfer cylinder 1 is provided with a partial cut-off portion 2, and a clamp comprising a holder 3 and a holder seat 4, which are means for attaching the top end side of an image receptor, and a clamp comprising a holder 5 and a holder seat 6, which are a means for attaching the bottom end side of the image receptor, are provided within the above partial cut-off portion. The holders 3 and 5 are provided with actuation shafts 7 on which the holders are actuated by a manual or electric actuation means. The holders are allowed to open and close by the rotation of the actuation means. The image receptor (not shown) such as paper is attached to the transfer cylinder by holding it with the top end side clamp, rotating the transfer cylinder in an arrow direction while the image receptor is under tension, and then holding the image receptor with the bottom end side clamp.

The constitution of a platen 8 will be explained with reference to FIG. 1. The platen 8 is provided with a partial cut-off portion 9. The surface of the platen 8 is wrapped with a blanket 10, and the blanket 10 is fixed within the partial cut-off portion with a blanket fixing means 11. The partial cut-off portion 9 has slope portions 12 extending between the partial cut-off portion and a platen surface (circumferential surface), and one slope portion is provided with a pin bar 13. The pin bar 13 is pressed on a platen surface by means of the blanket which has holes in places corresponding to pin positions of the pin bar 13. The pin bar 13 has such a height that its top does not protrude over the circumferential surface of the platen 8. That is because the pin bar 13 or the surface of the transfer cylinder 1 are not damaged in the rotation of the platen 8 and the transfer cylinder 1. A magnet sheet 14 may be tiltably attached within the partial cut-off portion 9 for further securing the holding of the image-forming material to the platen surface. An adhesive tape 15 is provided on a platen surface near the slope portion 12 where the pin bar 13 is located, and another adhesive tape 15 is also provided on a platen surface near the other slope portion 12. The magnet sheet 14 is not so wide as to reach the former adhesive tape 15 but is so wide as to cover the pin bar 13 when the magnet sheet is tilted in the direction opposite to an arrow. The top end side of an image-forming material has holes corresponding to pins of the pin bar 13. These holes are fit to the pins of the pin bar 13, and the image-forming material is pressed with the magnet sheet 14. Then, the platen 8 is turned in the direction of the arrow, and the top end side and bottom end side of the image-forming material are fixed to the surface of the platen with the adhesive tapes 15.

Figure 2:
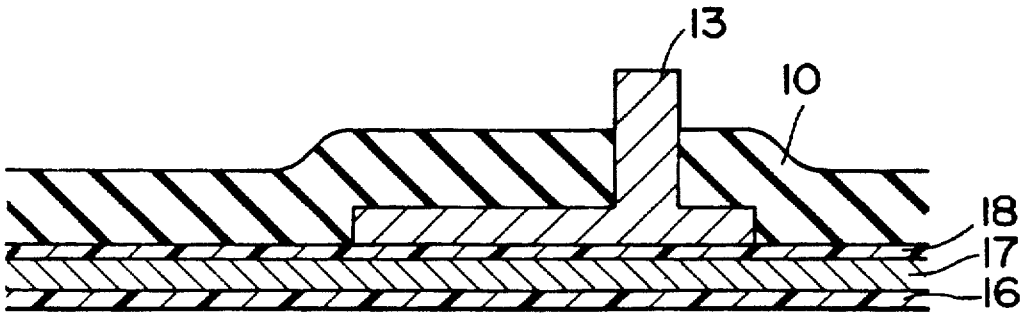
FIGS. 2 and 3 are schematic cross-sectional views of image-forming material attaching devices according to the present invention.
Figure 3:
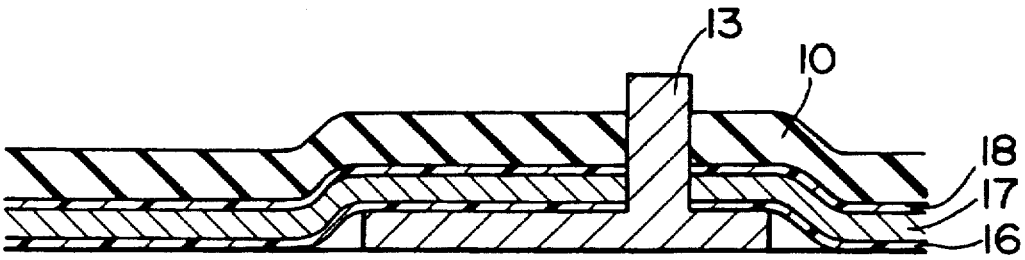

FIG. 2 shows the state in which the pin bar 13 is mounted. A first gage film 16 is placed on the platen surface. Then an elastic material 17 is placed thereon, and a second gage film 18 is placed thereon. Then, the pin bar 13 is placed thereon, and a blanket having holes corresponding to pins of the pin bar is stacked. These elements are fixed to the platen surface with the blanket fixing means 11 shown in FIG. 1, whereby the pin bar 13 is fixed in place. FIG. 3 shows a state in which the pin bar is directly placed on the platen surface, and the first gage film, the elastic material, the second gage film and the blanket, all of which have holes corresponding to the pins of the pin bar, are consecutively stacked.

As the gage films, a polyethylene terephthalate film is generally used. The gage film has the function of averaging the thickness variability when the blanket is used. The elastic material is generally formed of a cork in an unwoven fabric state, and has the function of imparting the platen surface with proper elasticity. The blanket is formed of a laminate prepared by stacking rubber layer(s) and cloth layer(s), and it is selected by taking elasticity and restorability into consideration.

Figure 4:
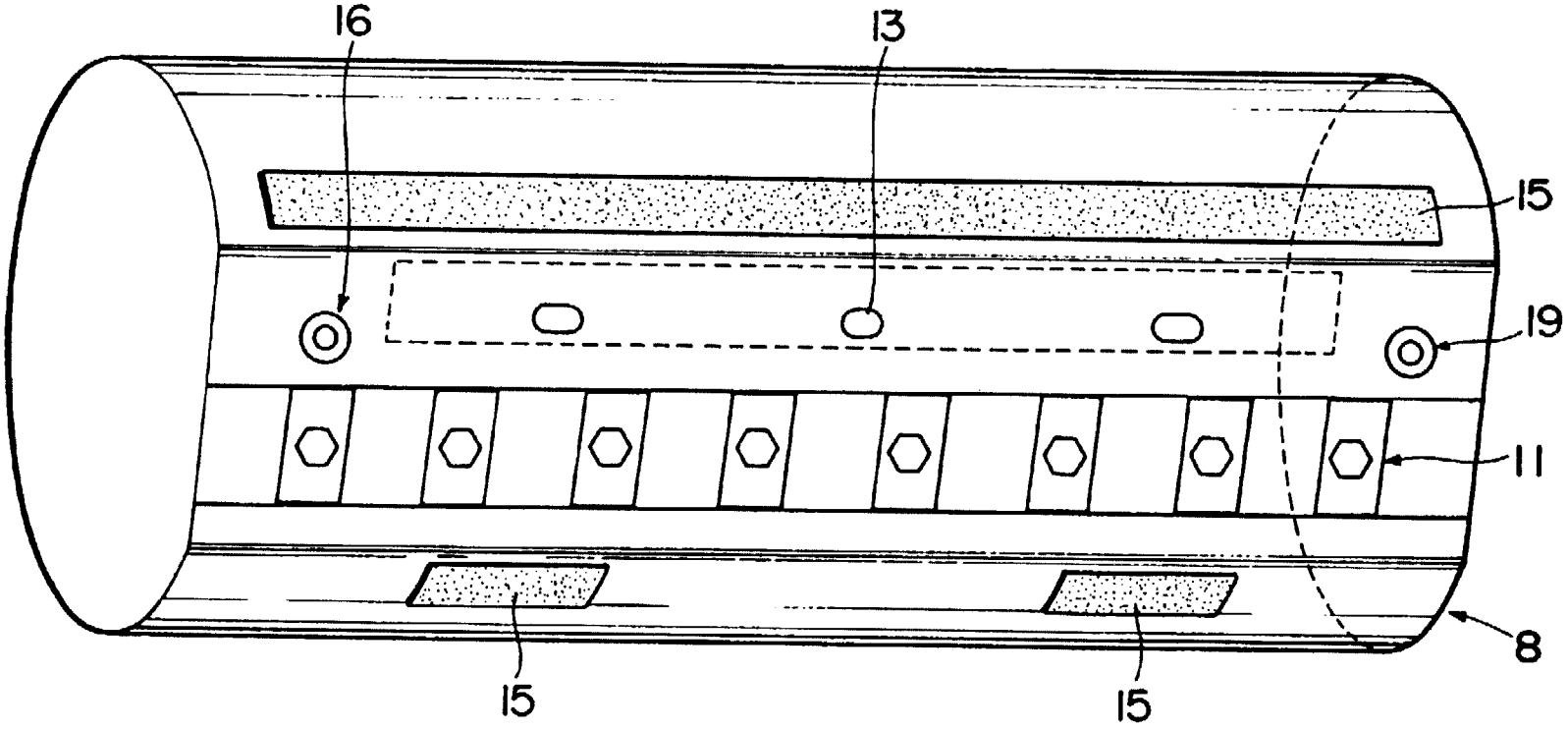
FIG. 4 is a schematic view of a platen having the means for peeling off the protection film, provided by the present invention.
Figure 5:
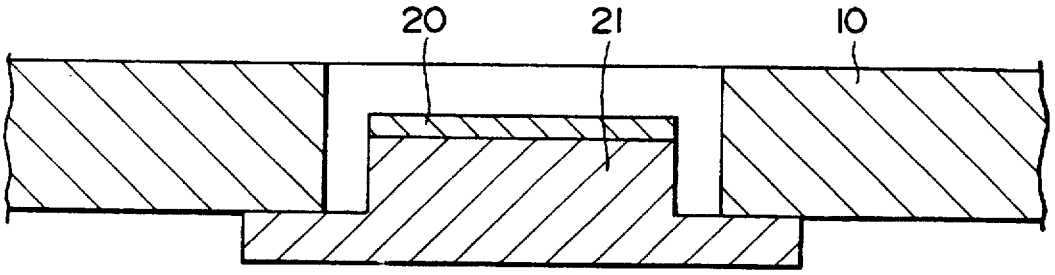
FIG. 5 is a schematic cross-sectional view of the means for peeling off the protection film, provided by the present invention.

FIG. 4 schematically shows a state in which means for peeling off the protection film is provided on the platen. The means [16] *19* for peeling off the protection film is provided near the top end side of the image-forming material (not shown) attached to the platen 8. In the means [16] *19* for peeling off the protection film, a hole is made in a predetermined place in the blanket 10 as shown in FIG. 5, and a means for sticking to the substrate of the image-forming material, such as an adhesive tape 20, is provided in the hole. For properly maintaining the height difference between the upper level of the blanket 10 and the sticking means, a projection portion 21 may be provided within the hole of the blanket, and the adhesive tape 20 may be attached to the upper surface of the projection portion. The blanket is formed of a laminate prepared by stacking rubber layer(s), and cloth layer(s) and it is selected by taking elasticity and restorability into consideration.

The function of the device for attaching the image-forming material, used in the present invention, will be explained hereinafter. The pin bar is fixed to the platen surface by means of the blanket, etc., and it can be therefore easily attached and detached. Further, there is caused no distinct height difference between the pin bar and the platen surface, and the image-forming material can be therefore attached to the platen with good registering accuracy. The positioning is accurately carried out by fitting the image-forming material having holes in positions corresponding to the pin bar 13 to the pin bar, then the platen 8 is rotated, and the image-forming material is attached to the platen surface by means of the top end side adhesive tape and the bottom end side adhesive tape. Thereafter, the image-forming material is pressed to the means 19 for peeling off the protection film to make the substrate stick to the adhesive tape 20, whereby the protection film is freed from the photosensitive layer formed on the substrate due to the height difference between the surface of the adhesive tape 20 and the surface of the blanket 10. The protection film can be easily peeled off by pulling the protection film.

INDUSTRIAL UTILITY

According to the present invention, there is provided an image transfer apparatus which permits the facile attaching and detaching of the pin bar and which gives a multi-color prepress proof or an image transfer product. According to the present invention, further, there is provided an image transfer apparatus which shows an improvement in workability in facile removal of the protection film from the image-forming material and which gives an aesthetically fine prepress proof or an image transfer product without causing the peeling of an unexposed portion, i.e., an image portion.

We claim:

1. An image transfer apparatus, which comprises a platen to which an image-forming material is to be attached and a transfer cylinder to which an image receptor is to be attached, and which is for transferring an image formed in a photosensitive layer of an image-forming material to an image receptor by the introduction of the image-forming material and the image receptor into a nip formed by the platen and the transfer cylinder by the rotation of the platen and the transfer cylinder, the apparatus having an image-forming material attaching device comprising a device for holding the top end side of the [image receptor] *image-forming material* to a platen surface along the entire width of the [image receptor] *image-forming material* and a device for holding the bottom end side of the [image receptor] *image-forming material* to a platen surface along the entire width of the [image receptor] *image-forming material*,

[the device for holding the top end side being a pin bar having pins protruded from an inside of a blanket in a slope portion continued from a partial cut-off portion formed in the platen] *the device for holding the top end side comprising a pin bar located between a blanket and a slope portion continued from a partial cut-off portion formed in the platen, the pin bar having pins protruding through the blanket.*

2. An image transfer apparatus according to claim 1, wherein the platen has a surface layer portion which is a laminate obtained by stacking a first gage film, an elastic material, a second gage film and a blanket in this order, the pin bar is placed inside the first gage film or the blanket and pins project through a surface layer portion located outside a place where the pin bar are placed.

3. An image transfer apparatus according to claim 1, wherein the image-forming material is formed of a substrate, a photosensitive layer formed on the substrate and a protection film stacked on the photosensitive layer, at least one means for peeling off the protection film is provided in a place in the platen corresponding to a place near a top end side of the image-forming material, and the means for peeling off the protection film is provided with an adhesive tape in a hole made in the blanket and in a position inside a blanket surface.

*4. An image transfer apparatus comprising a platen to which an image-forming material is to be attached and a transfer cylinder to which an image receptor is to be attached, and which is for transferring an image formed in a photosensitive layer of an image-forming material to an image receptor into a nip formed by the platen and the transfer cylinder by the rotation of the platen and the transfer cylinder, the image transfer apparatus further comprising:*

*a platen surface on the platen and a slope portion that slopes inwardly from the platen surface;*

*a blanket covering the platen surface and the slope portion, the blanket having an outer surface; and*

*an image-forming material attaching device comprising a device for holding a top end side of the image-forming material to the platen surface, said image-forming material attaching device comprising a pin bar having pins extending through the outer surface of the blanket.*

*5. The image transfer apparatus of claim 4, wherein the pin bar is located between the slope portion and an inner surface of the blanket, and the pins of the pin bar extend completely through the blanket.*

*6. The image transfer apparatus of claim 4, wherein the slope portion is continued from a partial cut-off portion formed in the platen.*

*7. The image transfer apparatus of claim 4, wherein the platen has a surface layer portion comprising a laminate of a first gage film, an elastic material, a second gage film and a blanket in this order, the pin bar is placed inside the first gage film or the blanket and pins project through a surface layer portion located outside a place where the pin bar is placed.*

*8. The image transfer apparatus of claim 4, wherein the image-forming material is formed of a substrate, a photosensitive layer formed on the substrate and a protection film stacked on the photosensitive layer, the image transfer apparatus further comprising at least one means for peeling off the protection film provided in a place in the platen corresponding to a place near a top end side of the image-forming material, the means for peeling off the protection film being provided with an adhesive tape in a hole made in the blanket and in a position inside a blanket surface.*

* * * * *